United States Patent [19]

Briefer

[11] 4,093,915
[45] June 6, 1978

[54] CAPACITANCE MEASURING SYSTEM

[75] Inventor: Dennis K. Briefer, Berlin, Mass.

[73] Assignee: Setra Systems, Inc., Natick, Mass.

[21] Appl. No.: 811,385

[22] Filed: Jun. 29, 1977

Related U.S. Application Data

[63] Continuation-in-part of Ser. No. 648,490, Jan. 12, 1976.

[51] Int. Cl.² ............................................. G01R 27/26
[52] U.S. Cl. .............................. 324/60 R; 324/61 QL
[58] Field of Search ................... 324/60 R, 60 C, 59, 324/60 CD, 61 R, 61 QS, 61 QL

[56] References Cited

U.S. PATENT DOCUMENTS

| | | | |
|---|---|---|---|
| Re. 27,829 | 12/1973 | Tiffany | 324/60 C X |
| 3,497,801 | 2/1970 | Clower et al. | 324/60 R |
| 3,585,496 | 6/1971 | Ichijo | 324/60 R |
| 3,641,414 | 2/1972 | Thompson | 324/61 R |
| 3,688,190 | 8/1972 | Blum | 324/61 R |
| 3,694,741 | 9/1972 | Abbe | 324/60 C |
| 3,862,571 | 1/1975 | Vogel | 324/60 C X |
| 4,006,411 | 2/1977 | Akagawa et al. | 324/61 R |

*Primary Examiner*—Stanley T. Krawczewicz
*Attorney, Agent, or Firm*—Kenway & Jenney

[57] ABSTRACT

A system for generating a signal linearly related to the capacitive reactance of a sensor capacitor. The system includes an oscillator for providing an oscillatory signal characterized by a peak-to-peak voltage proportional to an applied control signal, at least one capacitive network and associated peak detecting network, and a feedback network. The capacitive network includes a drive capacitor and a sensor capacitor connected in series between the oscillator and a reference potential, and the peak detector includes means to generate a peak signal representative of the peak-to-peak voltage at the junction between its associated coupling and sensor capacitor. The feedback network produces the control signal for the oscillator whereby the peak amplitude of the voltage across the drive capacitor is constant.

23 Claims, 11 Drawing Figures

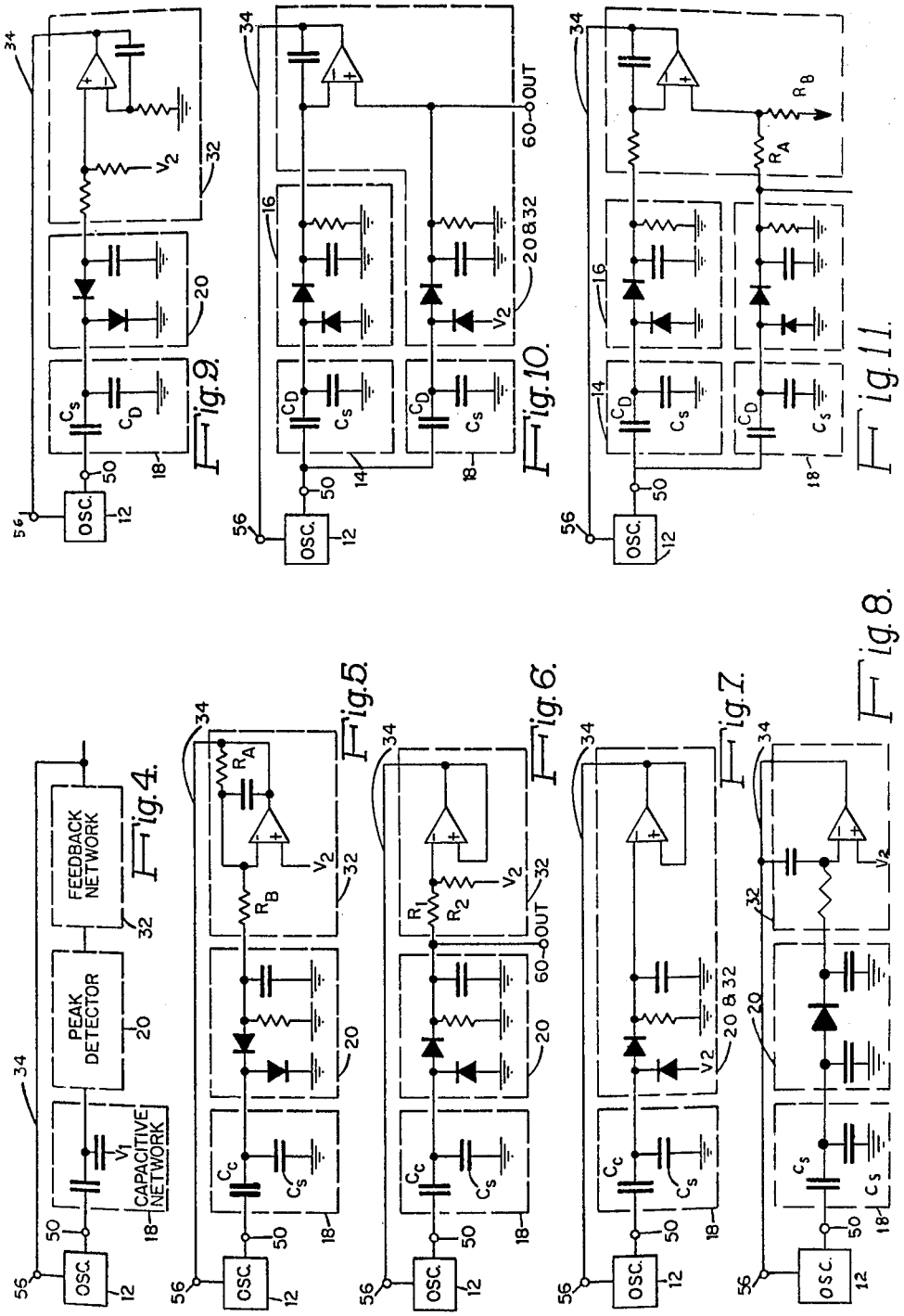

CAPACITANCE MEASURING SYSTEM

REFERENCE TO RELATED APPLICATION

This application is a continuation-in-part of U.S. patent application Ser. No. 648,490, filed Jan. 12, 1976 and assigned to the assignee of this application.

BACKGROUND OF THE INVENTION

This invention relates to measurement systems, and more particularly, to capacitance measurement systems.

Capacitive sensors have often been used to provide the input signals for many forms of prior art transducer instrumentation, for example, scales or balances, accelerometers, and pressure transducers or proximity gauges. In such systems, the precision at which measurements can be made is very much a function of the stability of the circuit interfacing the sensor portion and read-out-portion of the system. In general, the prior art systems have permitted relatively low precision measurements due to the sensitivity of the interface circuit to combinations of various factors such as drive signal waveshape, drive signal amplitude, drive signal frequency, and temperature dependent component parameter variation.

More particularly, the class of system exemplified by U.S. Pat. No. 3,318,153 to Lode includes circuit interface which generates an output signal as derived from a rectification and summing of current signals whose amplitude is dependent on both the magnitude and frequency of an applied drive signal, thereby requiring a high voltage drive signal at relatively low frequencies and establishing a relatively large power requirement. Thus, that system has a relatively high sensitivity to both drive signal amplitude and frequency, and, as a result, means is provided by Lode to maintain the amplitude-frequency product for the drive signal to be constant.

Other forms of prior art systems, such as that illustrated by U.S. Pat. No. 3,572,319 to Bittner are directed to systems for differential capacitance measurement which are drive signal waveshape sensitive as well as amplitude and frequency sensitive. More particularly, that system utilizes a means for extracting the average of the rectified voltage applied across the sensor, that average being a function of the waveshape of the driving signal.

Accordingly, it is an object of the present invention to provide a system for determining the capacitance associated with a sensor capacitor with the system being relatively independent of the amplitude, frequency, and waveshape of the driving signal.

Another object is to provide a signal linearly related to the capacitive reactance of a sensor capacitor.

SUMMARY OF THE INVENTION

According to one form of the present invention, the system includes an oscillator for providing an oscillatory signal characterized by a peak amplitude proportional to a control signal, a capacitive network and associated peak detecting network, and a feedback network. The capacitive network includes a drive capacitor and a sensor capacitor coupled in series between the oscillator and a first reference potential. The peak detecting network provides a peak signal representative of the peak voltage at the junction of the drive and sensor capacitors. The feedback network is responsive to the peak signal and to a reference potential to generate a control signal and apply that signal to the oscillator whereby the peak amplitude of the voltage across the drive capacitor is constant.

In another form of the present invention, an oscillator is adapted to provide an oscillatory signal characterized by a predetermined peak-to-peak voltage. This signal is applied to a pair of capacitive networks and associated peak detectors in a capacitive bridge configuration. Each capacitive network includes a coupling, or drive, capacitor and a sensor capacitor connected in series from the oscillator to a common potential, with its associated peak detector having is input terminal connected to the junction point between the sensor and coupling capacitor. The sensor capacitors of the capacitive networks may both vary with external parameters (such as pressure) or, alternatively, one may be fixed to serve as a reference while the other varies with an external parameter.

The system further includes a combining network for providing an output signal proportional to the difference in magnitude of the peak signals generated by the peak detectors. In one form of the invention, the oscillator includes a limiter which restricts the voltage excursion of the oscillator output signal to be within predetermined uper and lower limits defining the predetermined peak-to-peak voltage. The limiter may be in the form of a diode limiter. The limited oscillator output signal is applied to the capacitive voltage dividers established by the coupling and sensor capacitors. The peak-to-peak voltage across each of the sensor capacitors is converted to d.c. by the associated peak detector to form peak signals. The peak signals are combined to generate a signal representative of the difference in peak-to-peak magnitude of the signals across the sensor capacitors.

Since the only peak voltage is used, the system may utilize a driving signal at a frequency which is relatively high, so that the capacitor reactances are low and the two peak voltage signals generated by the peak detectors may be combined in a resistive summing network. Furthermore, the use of a relatively high frequency drive signal permits operation with resonant energy exchange between the oscillator and capacitive networks, with consequent low power consumption and increased stability. As a result of using peak detection, the present invention is relatively insensitive to frequency of the driving signal, and, in addition, is relatively insensitive to waveshape of the driving signal (in contrast to prior art systems using an average of the rectified drive signal).

As a further advantage of the present circuit, wherein diode limiters are utilized to establish a predetermined peak-to-peak driving signal and wherein further the peak detectors utilize a well-known diode networks, temperature dependent variations in this circuitry due to temperature varying diode forward drops are offset so that the system is also relatively temperature insensitive.

In another form, the present invention provides a relatively large dynamic rang and may accommodate relatively large changes in sensor capacitance, such as produced by the reduction in separation of the sensor capacitor plate elements towards zero. In this form, the output signal of the system, which is representative of the difference in capacitance of the associated sensor capacitors, may be fed back to the oscillator and diode limiting network in order to produce a change in the excitation voltage, i.e., the peak-to-peak value associated with the oscillator output signal. At such times when the sensor capacitors are characterized by relatively large differences in capacitance, a relatively low excitation may be applied to the circuit, thereby reducing the sensitivity so that the operating point of the system does not fall outside its dynamic linear range.

BRIEF DESCRIPTION OF THE DRAWINGS

The foregoing and other objects of this invention, the various features thereof, as well as the invention itself, may be more fully understood from the following description, when read together with the accompanying drawings in which:

FIG. 4 shows, in block diagram form, a capacitance measuring system in accordance with the present invention; and FIGS. 5–11 show, in detailed schematic form, additional configurations of the system of FIG. 4.

DESCRIPTION OF THE PREFERRED EMBODIMENT

Figure 1:
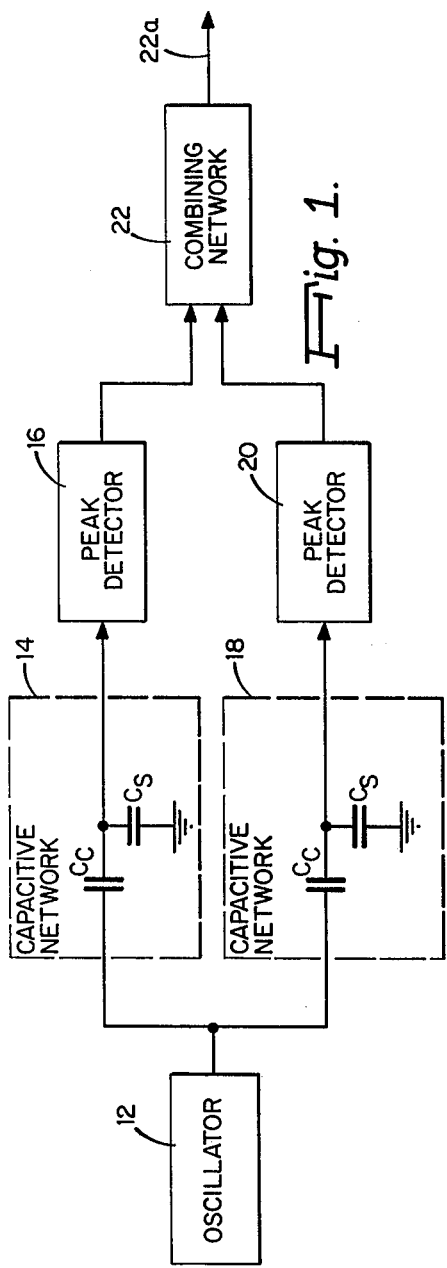
FIG. 1 shows, in block diagram form, a differential capacitance measuring system in accordance with the present invention.

An embodiment of the present invention is shown in FIG. 1 having an oscillator 12 connected to a capacitive network 14 and an associated peak detector 16, and to a capacitive network 18 and an associated peak detector 20. Each of networks 14 and 18 include a coupling, or drive, capacitor $C_c$ and a sensor capacitor $C_s$ connected in series between the oscillator output terminal and a common reference (ground) potential. The peak detectors 16 and 20 each have their output signals applied to a combining network 22 which in turn provides an output signal on line 22a. It will be understood that detectors 16 and 20 and combining network 22 are arranged so that network 22 provides an output signal on line 22a which is representative of the difference between the magnitude of the peak-to-peak values of the signals applied to the respective inputs of detectors 16 and 20.

Figure 2:
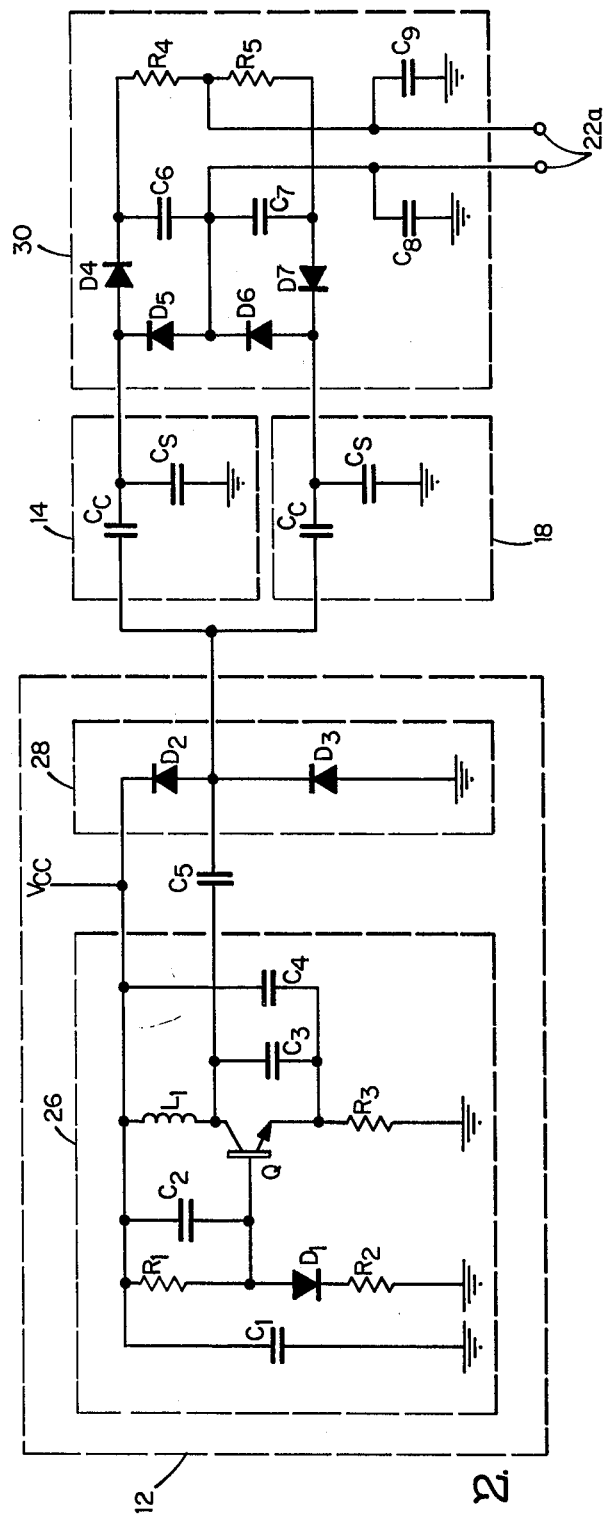
FIG. 2 shows, in detailed schematic form, the system of FIG. 1.

FIG. 2 shows an embodiment of the circuit of FIG. 1 in detailed schematic form. The oscillator 12 of the FIG. 2 circuit includes an oscillatory signal generator 26 and a diode limiter 28 which is a.c. coupled to the oscillator 26 by way of capacitor C5. The exemplary generator 26 is a common base oscillator comprising Q, C1 – C4, R1 – R3, D1 and L1. The oscillator 12 peak-to-peak output level is maintained relatively constant in this configuration. The outputs of the capacitive networks 14 and 18 are respectively applied to the composite network 30 in FIG. 2. Network 30 represents one embodiment of the combination of peak detectors 16 and 20 and combining network 22. In this network 30, the peak-to-peak voltage across the sensor capacitor of network 14 is converted to a positive d.c. voltage by D4, D5, and C6, and the peak voltage across the sensor capacitor of network 18 is converted to a negative d.c. voltage by D6, D7, and C9. Resistors R4 and R5 sum these d.c. voltages to form a resultant signal with respect to the common point of diodes D5 and D6 and capacitors C6 and C7 across the output terminal pair 22a. Capacitors C8 and C9 provide by-pass filtering to ground.

Since only the peak-to-peak voltage is utilized via the network 30, the output signal across terminals 22a is relatively insensitive to frequency and waveshape of the drive signal applied from oscillator 12. Furthermore, the system is relatively stable with respect to changes in temperature since temperature dependent changes in the diode drop across limiting diodes D2 and D3 are effectively offset by similar drops in the peak detector diodes. Furthermore, the use of the peak-to-peak voltage via network 30 permits relatively high frequency operation with resonant energy exchanged between L1 of oscillator 26 and the capacitive networks 14 and 18, thereby permitting relatively low power consumption and high stability. As a further result of the high frequency operation, the relatively low capacitive reactances render small resistive leakages across the sensor capacitors to be of little importance.

Accordingly, with the present invention, a relatively high frequency drive signal may be utilized and the detection network is relatively insensitive to the waveshape of the frequency of the drive signal. Furthermore, as indicated, the resultant network is relatively insensitive to temperature changes.

Figure 3:
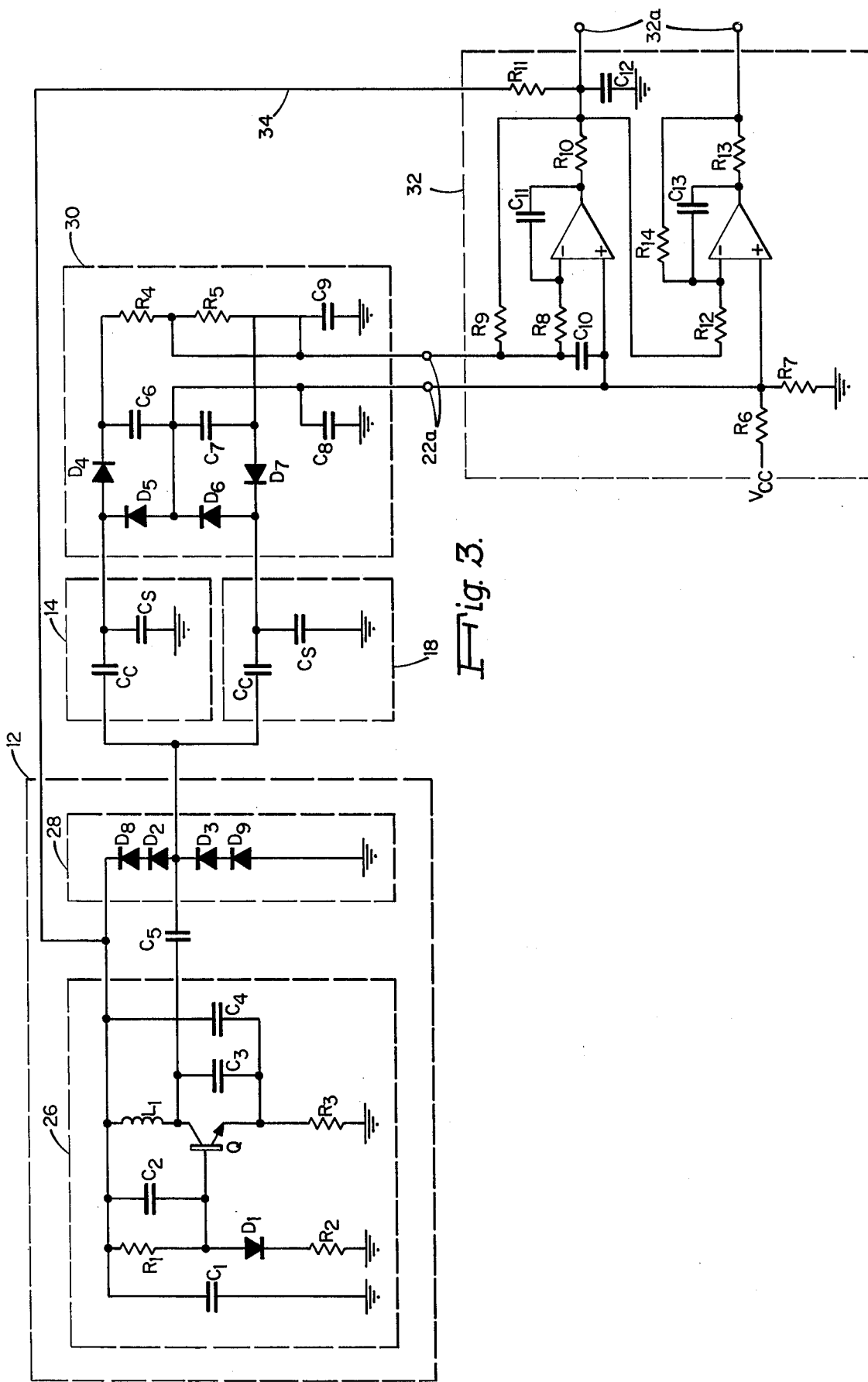
FIG. 3 shows, in detailed schematic form, an alternative configuration embodying the present invention.

FIG. 3 illustrates a further embodiment of the present invention. In this embodiment, circuit elements having corresponding counterparts in the FIG. 2 embodiment are identified with identical reference symbols. In the embodiment of FIG. 3, the power supply for the oscillator 12 is provided by the feedback signal generated from the feedback network 32 by way of line 34. This feedback signal is equal to the d.c. signal produced by the external supply $V_{cc}$ and voltage divider resistors R6 and R7, as reduced by a signal representative of the difference in capacitance of the sensor capacitors of networks 24 and 18. The signal across terminal pair 32a is representative of the difference in capacitance of the sensor capacitors of networks 14 and 18.

For the illustrated embodiment, exemplary values for the circuit elements are listed in the following table for nominal operation with an approximately 4 volt peak-to-peak, 5 MHz drive signal (with the sensor capacitors approximately equal), and utilizing the capacitive sensor elements of Type 90H, manufactured by MKS Instruments, Inc., Burlington, Mass. with nominal capacitance on the order of 30 picofarads. For operation with minimum sensitivity to temperature, the following diode pairs include matched diodes: D2 and D3, D4 and D7, D5 and D6, D8 and D9.

TABLE

| R1 - | 47 ohms | C1 - | .01 uf |
|---|---|---|---|
| R2 - | 8,200 ohms | C2 - | 470 pf |
| R3 - | 510 ohms | C3 - | 68 pf |
| R4 - | 100,000 ohms | C4 - | 1000 pf |
| R5 - | 100,000 ohms | C5 - | 2700 pf |
| R6 - | 10,000 ohms | C6 - | 270 pf |
| R7 - | 10,000 ohms | C7 - | 270 pf |
| R8 - | 47,000 ohms | C8 - | .01 uf |
| R10 - | 20 ohms | C9 - | .01 uf |
| R11 - | 20 ohms | C10 - | 270 pf |
| R12 - | 20,000 ohms | C11 - | 270 pf |
| R13 - | 20 ohms | C12 - | .01 uf |
| R14 - | 20,000 ohms | C13 - | 270 pf |
| L1 - | 10 uh | $C_c$ - | 33 pf |

R9 may be selected to match the particular sensors used in order to establish operation in a desired dynamic range.

In operation, wherein the sensor capacitors are characterized by relatively similar capacitance values, oscillator 12 provides the relatively constant peak-to-peak amplitude signal to the common point of capacitors $C_c$ in both networks 14 and 18, with the resultant bridge providing at terminals 22a a signal proportional to the difference in capacitance of the sensor capacitors $C_s$ of network 14 and 18. In the event the capacitance of the sensor capacitors becomes greatly different (for example, in a pressure transducer as the diaphragm plates of one sensor capacitor are pushed almost together with the resultant capacitance associated with that capacitor becoming very large while the other sensor capacitor has its diaphragm plates located at their nominal separation), the feedback network 32 lowers the level of the power supply signal on the feedback line 34 to the oscillator 12. As a result, the amplitude of the oscillatory signal produced by network 26, is correspondingly reduced, thereby decreasing sensitivity of the overall circuit to accommodate the external condition of the sensor capacitor.

In the configuration of FIG. 3, the capacitive reactance of the drive capacitors $C_1$ of networks 14 and 18, and the sensor capacitor $C_3$ of network 14 may be maintained constant and equal while the capacitive reactance of the sensor capacitor $C_s$ of network 18 may vary with an external parameter, such as pressure. For the circuit values set forth in the Table, the peak amplitude of the a.c. voltage across the drive capacitor $C_c$ of network 18 is constant and the feedback signal to network 12 is a linear function of the capacitive reactance of the sensor capacitor of network 18.

The configuration of FIG. 3 may also be set forth in the form illustrated in FIG. 4, for example, where the ratio R4/R5 is large. In FIG. 4, elements corresponding to those in FIGS. 1–3 are denoted with identical reference numerals. The capacitive network 18 includes a drive capacitor and sensor capacitor connected in series between a system input terminal 50 and a first reference potential V1. As noted more fully below, the relative position of the capacitors within this series connection may vary for different embodiments. The peak detector 20 couples the junction between the drive and sensor capacitors to the input of a feedback network 32. The feedback network 32 is responsive to the signal from the peak detector and to a second reference potential V2 to provide a feedback signal by way of feedback path 34 to a control terminal 56 for oscillator 12. Oscillator 12 is adapted so that the peak amplitude at terminal 50 is proportional to the signal at control terminal 56.

FIGS. 5–11 illustrate further embodiments wherein the feedback signal on path 34 is a linear function of the capacitive reactance of the sensor capacitor $C_s$. In the embodiments of FIGS. 5–7, the first reference potential V1 is ground potential and the sensor capacitor $C_s$ is coupled to that potential, with the drive capacitor $C_D$ being coupled to the system input terminal 50. FIGS. 8 and 9 depict further embodiments wherein V1 is ground potential and the sensor capacitor $C_s$ is coupled to the system input terminal 50 and the drive capacitor is coupled to potential V1.

In the configuration of FIG. 5, the ratio $R_A/R_B$ equals unity to ensure a linear relationship between the feedback signal and the reactance of $C_s$. In the FIG. 6 embodiment, the gain between terminals 56 and 50 may be set to be proportional to $(R1 + R2)/R1$. In this case, the output from the peak detector 20 is directly proportional to the capacitive reactance of the sensor capacitor of network 18.

In all the configurations of FIG. 5–FIG. 9, the constant of proportionality for the feedback signal of path 34 is related to the gain between terminals 56 and 50. Accordingly, for maximum stability of these capacitance measuring systems with respect to temperature, this gain may be temperature compensated, for example, by way of a limiting network such as network 28 in the FIG. 3 configuration.

FIGS. 10 and 11 illustrate additional embodiments of the present invention, and in those figures, elements corresponding to those in the earlier shown embodiments are denoted by identical reference numerals. Each of the configurations of FIGS. 10 and 11 includes a first capacitive network 14 and associated peak detector 16 and a second capacitive network 18 and associated peak detector 20. The peak detector output signals are combined in the feedback network 32 together with a reference potential V2 to provide a feedback signal on path 34. In each system, the output signal on terminal 60 may be proportional to the capacitive reactance of the sensor capacitor in network 18. In the circuit of FIG. 11, this latter characteristic occurs when $R_A$ equals $R_B$. By adjusting the ratio of $R_A$ to $R_B$, different relationships may be attained.

For the circuits of FIGS. 10 and 11, the output signals at terminal 60 are substantially independent of variations in the oscillator gain (i.e., between terminals 56 and 50) such as might be due to temperature. In addition, these circuits are substantially independent of characteristic changes in the diodes in the detector networks. Particularly with respect to the circuit of FIG. 11, the diodes in peak detectors 16 and 20 are at substantially the same operating point, thereby providing optimal stability with respect to temperature.

In the configuration of FIGS. 10 and 11, since the output signals are independent of the gain between terminals 56 and 50, a relatively straightforward oscillator circuit may readily be used without a temperature compensating network such as network 28 illustrated in the FIG. 3 configuration.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A capacitance measuring system comprising:

A. an oscillator including means for providing at an output terminal an oscillatory signal relative to a ground potential, said oscillatory signal being characterized by a predetermined peak-to-peak voltage, B. a first capacitive network and associated first peak detecting network, said first capacitive network including a coupling capacitor and a first sensor capacitor connected in series between said output terminal and said ground potential, said first sensor capacitor having one terminal connected to said ground potential, and said first peak detecting network being connected to the junction between said coupling and first sensor capacitors and including means to generate a first peak signal representative of the peak-to-peak voltage at said junction, C. A second capacitive network and associated second peak detecting network, said second capacitive network including a coupling capacitor and a second sensor capacitor connected in series between said output terminal and said ground potential, said second sensor capacitor having one terminal connected to said ground potential, and said second peak detecting network being connected to the junction between said coupling and second sensor capacitors and including means to generate a second peak signal signal representative of the peak-to-peak voltage at said junction, D. combining means coupled to an output terminal of said first and second peak detecting networks for producing an output signal representative of the difference in magnitude of said first and second peak signals.

2. The system according to claim 1 wherein said oscillator includes an oscillatory signal generator coupled through an amplitude limiter to said output terminal, whereby said limiter restricts voltage excursions of the signal produced by said generator to be within predetermined upper and lower limit values defining said predetermined peak-to-peak voltage.

3. The system according to claim 2 wherein said limiter includes first branch connected between said output terminal and a first reference potential, and a second branch connected between said output terminal and a second reference potential, said first reference potential being greater than said second reference potential, and wherein said first branch includes at least one branch diode arranged to be forward conducting from said output terminal to said first reference potential when the voltage at said terminal equals said upper limit value, and wherein said second branch includes at least one branch diode arranged to be forward conducting from said second reference potential to said output terminal when the voltage at said terminal equals said lower limit value.

4. The system according to claim 3 wherein said first and second peak detecting networks include a pair of series arranged diodes connected in parallel with a capacitor between said peak detecting network output terminal and a reference potential, and wherein the junction between said series diodes is connected to the junction between the coupling and sensor capacitors associated with each peak detecting network whereby temperature induced changes in the forward voltage drops across said branch diodes are substantially offset.

5. The system according to claim 1 further comprising a feedback means for applying a feedback signal to said oscillator said, feedback signal being proportional to said output signal, and wherein said oscillator includes means responsive to said feedback signal to control said predetermined peak-to-peak voltage to be functionally related to said feedback signal.

6. The system according to claim 5 wherein said oscillator includes an oscillatory signal generator coupled through an amplitude limited to said output terminal, whereby said limiter restricts the peak voltage excursions of the signal produced by said generator to be within predetermined upper and lower limit values defining said predetermined peak-to-peak voltage, at least one of said upper and lower limits being related to said feedback signal.

7. The system according to claim 6 wherein said limiter includes first branch connected between said output terminal and a first reference potential, and a second branch connected between said output terminal and a second reference potential, said first reference potential being greater than said second reference potential, and wherein said first branch includes at least one branch diode arranged to be forward conducting from said output terminal to said first reference potential when the voltage at said terminal equals said upper limit value, and wherein said second branch includes at least one branch diode arranged to be forward conducting from said second reference potential to said output terminal when the voltage of said terminal equals said lower limit value.

8. The system according to claim 7 wherein said first and second peak detecting networks include a pair of series arranged diodes connected in parallel with a capacitor between said peak detecting network output terminal and a reference potential, and wherein the junction between said series diodes is connected to the junction between the coupling and sensor capacitors associated with each peak detecting network whereby temperature induced changes in the forward voltage drops across said branch diodes are substantially offset.

9. A system for generating a signal functionally related to the capacitive reactance of a sensor capacitor, comprising:

A. a first capacitive network and associated first peak detecting network, said first capacitive network including a first drive capacitor and a first sensor capacitor connected in series between a system input terminal and a first reference potential, and said associated peak detecting network being connected to the junction between said first drive and first sensor capacitors and including means for generating a peak signal representative of the peak voltage at said junction, B. an oscillator coupled to said system input terminal and having a control terminal, said oscillator including means to generate an oscillatory signal at said system input terminal, said oscillatory signal being characterized by an amplitude proportional to the voltage at said control terminal, and C. feedback network coupled between said first peak detecting network and said control terminal, said feedback network including means responsive to said peak signal and a second reference potential to apply a feedback signal to said control terminal whereby the peak amplitude of the voltage across said drive capacitor is constant.

10. The system according to claim 9 wherein said first drive capacitor is coupled between said oscillator and said peak detecting network and wherein said feedback network includes a differential amplifier network having a non-inverting input terminal, and inverting input terminal, and an output terminal, said non-inverting terminal being coupled to said second reference potential, and said inverting terminal being coupled by resistor $R_A$ to said peak detecting network, and said output terminal being coupled to said control terminal by a feedback path and further being coupled to said inverting input terminal by resistor $R_B$ wherein $R_A = R_B$.

11. The system according to claim 9 wherein said first drive capacitor is coupled between said oscillator and said peak detecting network and wherein said feedback network includes:

i. combining means coupled to said peak detecting network for generating a signal representative of the sum of said peak voltage and a predetermined constant voltage, ii. differential amplifier network having a noninverting input terminal, and inverting input terminal, and an output terminal, said noninverting terminal being coupled to said combining network and said peak detecting network, said inverting terminal being coupled to said output terminal by a first feedback path, and said output terminal being coupled to said control terminal by a second feedback path.

12. A system according to claim 11 wherein said peak detecting network and combining network comprise two series connected diodes coupled in the same direction between said second potential and said non-inverting input terminal, with the junction between said diodes being connected to said junction between said first drive and first sensor capacitors, and wherein the constant of proportionality relating the amplitude of said oscillatory signal and said voltage at said amplifier output terminal is unity, whereby said voltage at said amplifier output terminal is a linear function of the capacitive reactance of said first sensor capacitor.

13. A system according to claim 11 wherein said peak detecting network comprises two series connected diodes coupled in the same direction between said first reference potential and a system output terminal, with the junction between said diodes being connected to the junction between said first coupling and first sensor capacitors, and wherein said combining network comprises a first resistor (R1) connected between said system output terminal and said non-inverting terminal, and a second resistor (R2) connected between second reference potential and said non-inverting terminal, and wherein the constant of proportionality relating the amplitude of said oscillatory signal and said voltage at said amplifier output terminal equals (R1 + R2/(R1), whereby the voltage at said system output terminal is proportional to the capacitive reactance of said first sensor capacitor.

14. A system according to claim 9 wherein said first sensor capacitor is coupled between said oscillator and said peak detecting network, and wherein said feedback network includes:

i. combining means coupled to said peak detecting network for generating a signal representative of the difference of said peak voltage and a predetermined constant voltage, ii. differential amplifier network having a noninverting input terminal, and inverting-input terminal, and an output terminal, said noninverting terminal being coupled to said combining network, and said inverting terminal being coupled to said output terminal by a capacitive feedback path, and said output terminal being coupled to said control terminal by a feedback path.

15. A system according to claim 14 wherein said peak detecting network and combining network comprise two series connected diodes coupled in the same direction between said first reference potential and said non-inverting input terminal, with the junction between said diodes being connected to said junction between said first drive and first sensor capacitors, and wherein said combining network comprises a first resistor connected between said peak detector and said non-inverting terminal, and a second resistor connected between said second reference potential and said non-inverting terminal, and wherein the constant of proportionality relating the amplitude of said oscillatory signal and said voltage at said amplifier output terminal is unity, whereby said voltage at said amplifier output terminal is a linear function of the capacitive reactance of said first sensor capacitor.

16. A system according to claim 9 wherein said first sensor capacitor is coupled between said oscillator and said peak detecting network, and wherein said feedback network includes differential amplifier network having a non-inverting input terminal, and inverting input terminal, and an output terminal, said non-inverting terminal being coupled to said second reference potential, and said inverting terminal being coupled to said peak detecting network and being further coupled to said output terminal by a capacitive feedback path, and said output terminal being coupled to said control terminal by a feedback path.

17. A system according to claim 16 wherein said peak detecting network comprises two series connected diodes coupled in the same direction between said first reference potential and said non-inverting input terminal, with the junction between said diodes being connected to said junction between said first drive and first sensor capacitors, and wherein the constant of proportionality relating the amplitude of said oscillatory signal and said voltage at said amplifier output terminal is unity, whereby said voltage at said amplifier output terminal is a linear function of the capacitive reactance of said first sensor capacitor.

18. A system according to claim 9 wherein said first drive capacitor is coupled between said oscillator and said first peak detecting network. and wherein said feedback network includes:

i. combining means coupled to said peak detecting network for generating a signal representative of the sum of said peak voltage and a predetermined constant voltage, ii. differential amplifier network having a noninverting input terminal, and inverting input terminal, and an output terminal, said noninverting terminal being couples to said combining network and said first peak detecting network, and said inverting terminal being coupled to said output terminal by a capacitive feedback path, and said output terminal being coupled to said control terminal by a feedback path, and further comprising:

second capacitive network and associated peak detecting network, said second capacitive network including a second drive capacitor and a secnd capacitor between sais system input terminal and said first reference potential, and said associated peak detecting network being connected to the junction between said second drive and second sensor capacitors, said second drive capacitor being coupled between said oscillator and said peak detecting network, and said peak detecting network including means for generating a signal representative of the peak voltage at said junction and applying that signal to said inverting terminal.

19. A system according to claim 18 wherein said first peak detecting network and combining network comprise two series connected diodes coupled in the same direction between said second reference potential and said non-inverting terminal, with the junction between said diodes being connected to said junction between said first drive and first sensor capacitors, and wherein said second peak detecting network comprises two series connected diodes coupled in the same direction between said first reference potential and said inverting terminal, with the junction between said diodes being connected to the junction between said first coupling and first sensor capacitors, whereby the voltage at said non-inverting terminal is proportioned to the capacitive reactance of said first sensor capacitor.

20. A system according to claim 18 wherein said first peak detecting network comprises two series connected diodes coupled in the same direction between first reference potential and a system output terminal, with the junction between said diodes being connected to said junction between said first drive and first sensor capacitors, and wherein said combining network comprises a first resistor connected between said system output terminal and said noninverting terminal, and a second resistor connected between a reference potential and said non-inverting terminal, and wherein said second peak detecting network comprises two series connected diodes coupled in the same direction between first reference potential and said inverting terminal, with the junction between said diodes being connected to said junction between said first drive and first sensor capacitors.

21. A system according to claim 20 wherein $R_A = R_B$, whereby the voltage at said system output terminal is proportioned to the capacitive reactance of said first sensor capacitor.

22. A system according to claim 9 wherein said first drive capacitor is coupled between said oscillator and said first peak detecting network, and further comprising:

second capacitive network and associated peak detecting network, said second capacitive network including a second drive capacitor and a second capacitor between said system input terminal and said first reference potential, and said associated peak detecting network being connected to the junction between said second drive and second sensor capacitors, said second drive capacitor being coupled between said oscillator and said peak detecting network, and said peak detecting network including means for generating a signal representative of the peak voltage at said junction between said second drive and second sensor capacitors, wherein said feedback network includes:
 i. combining means coupled to said first and second peak detecting networks for generating a combined signal representative of the difference of said peak voltages,
 ii. differential amplifier network having a noninverting input terminal, and inverting input terminal, and an output terminal, said inverting terminal being coupled to said combining network, said non-inverting terminal being coupled to said second reference potential, and said output terminal being coupled to said control terminal by a first feedback path and to said inverting terminal by a second feedback path.

23. A system according to claim 22 wherein said first peak detecting network and combining network comprise a first pair of diodes coupled in series in the same direction between said first reference potential and said combining network, with the junction between said diodes being connected to said junction between said first drive and first sensor capacitors, and wherein said second peak detecting network comprises a second pair of diodes coupled in series in the same direction between said first reference potential and said inverting terminal, with the junction between said diodes being connected to the junction between said first coupling and first sensor capacitors wherein one of said pairs of diodes is adapted to pass current to said first reference potential when forward biased, and the other of said pairs is adapted to pass current from said first reference potential when forward biased.

* * * * *